United States Patent [19]

Oberg

[11] Patent Number: 4,819,094
[45] Date of Patent: Apr. 4, 1989

[54] DAMPED MAGNETIC HEAD SUSPENSION ASSEMBLY

[76] Inventor: Gary R. Oberg, Route 1, Box 25C, Darwin, Minn. 55324

[21] Appl. No.: 129,848

[22] Filed: Dec. 8, 1987

Related U.S. Application Data

[63] Continuation-in-part of Ser. No. 895,835, Aug. 12, 1986.

[51] Int. Cl.$^4$ .................................................. G11B 5/48
[52] U.S. Cl. ..................................... 360/104; 360/137
[58] Field of Search ............ 360/104, 103, 102, 97–99, 360/105, 106

[56] References Cited

U.S. PATENT DOCUMENTS

| | | | |
|---|---|---|---|
| 3,931,641 | 1/1976 | Watrous | 360/104 |
| 4,167,765 | 9/1979 | Watrous | 360/103 |
| 4,208,684 | 6/1980 | Janssen et al. | 360/104 |
| 4,216,505 | 8/1980 | Grant et al. | 360/104 |
| 4,286,297 | 8/1981 | Root et al. | 360/103 |
| 4,399,476 | 8/1983 | King | 360/104 |
| 4,489,484 | 12/1984 | Lee | 360/103 |
| 4,625,249 | 11/1986 | Iwata | 360/105 |
| 4,645,280 | 2/1987 | Gordon et al. | 360/104 |
| 4,647,998 | 7/1987 | Onohara et al. | 360/104 |

FOREIGN PATENT DOCUMENTS

| | | | |
|---|---|---|---|
| 121057 | 10/1984 | European Pat. Off. | 360/104 |
| 53-30310 | 3/1978 | Japan | 360/104 |
| 56-19554 | 2/1981 | Japan | 360/104 |

OTHER PUBLICATIONS

Watrous, "Low-Load Beam Suspension for Magnetic Heads", IBM Technical Disclosure Bulletin, vol. 18, No. 11, Apr. 1976, pp. 3813-3814.
Rynders et al., "Damped Slider Mount", IBM Technical Disclosure Bulletin, vol. 11, No. 3, Aug. 1968, p. 248.
Norwood, "Damped Head Arm", IBM Technical Disclosure Bulletin, vol. 21, No. 8, Jan. 1979, p. 3093.
Church et al., "Method for Wiring a Magnetic Head", IBM Technical Disclosure Bulletin, vol. 23, No. 8, Jan. 1981, pp. 3873-3874.

*Primary Examiner*—John H. Wolff
*Assistant Examiner*—Matthew J. Bussan
*Attorney, Agent, or Firm*—Dorsey & Whitney

[57] ABSTRACT

Magnetic head suspension assemblies are improved by adhesively bonding a flexible circuit to a suspension. Damping is provided as well as a reduction in height.

13 Claims, 1 Drawing Sheet

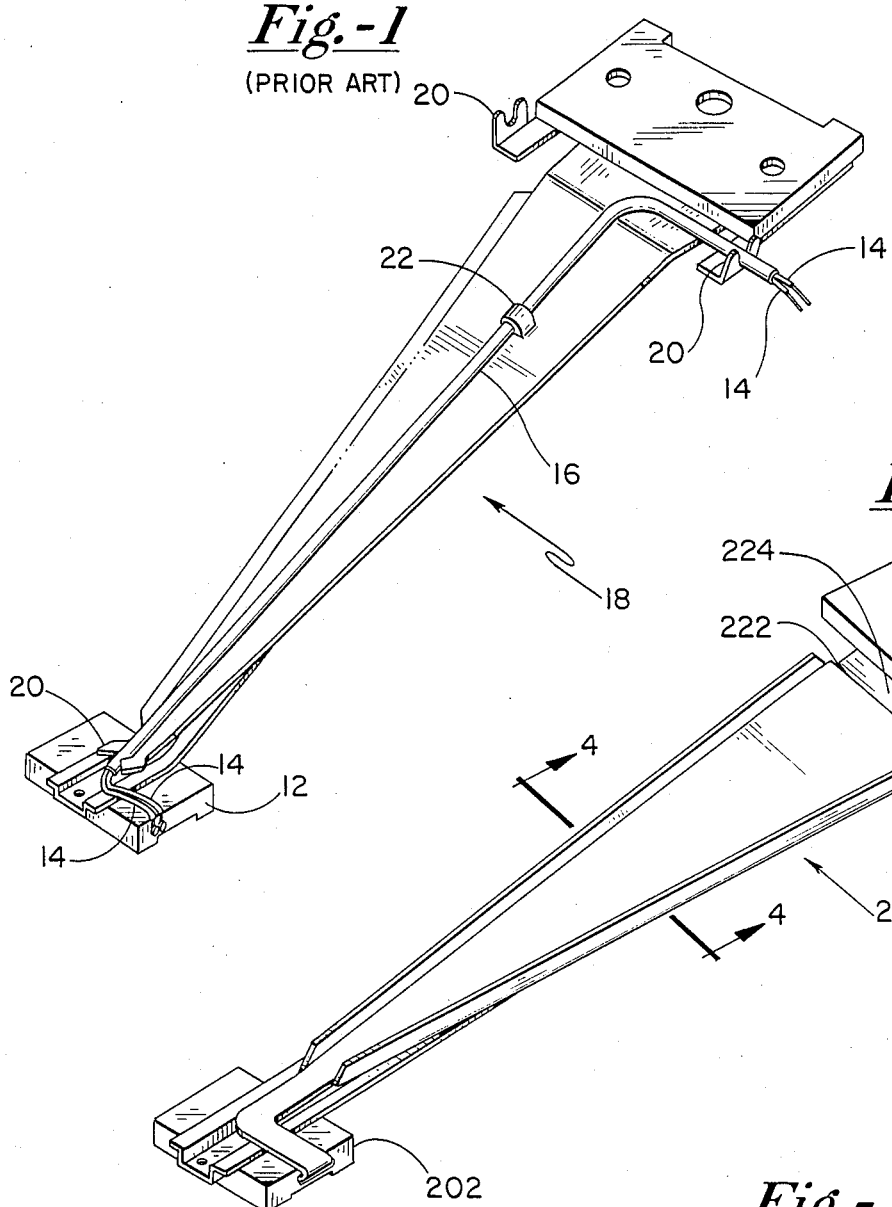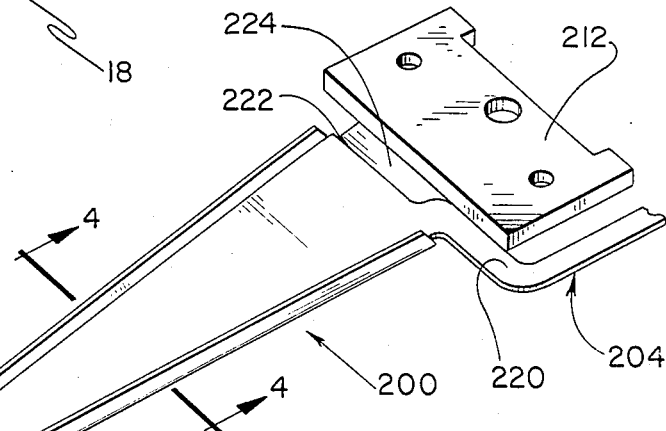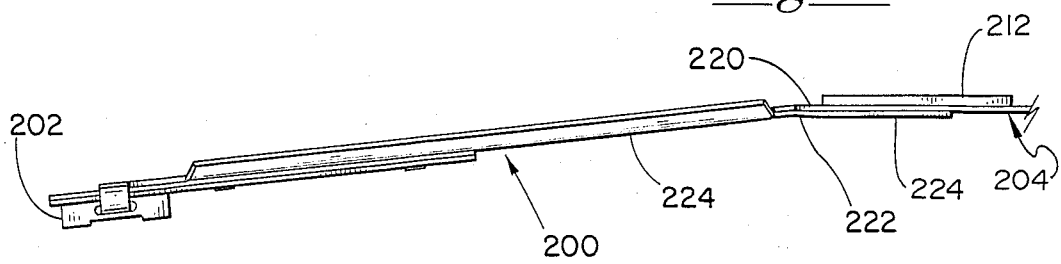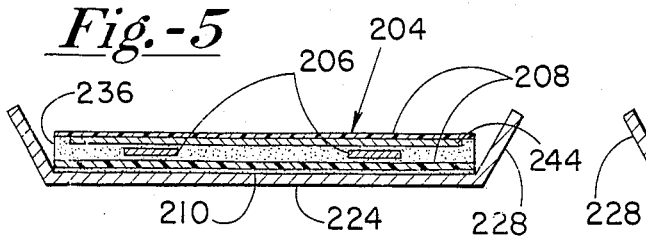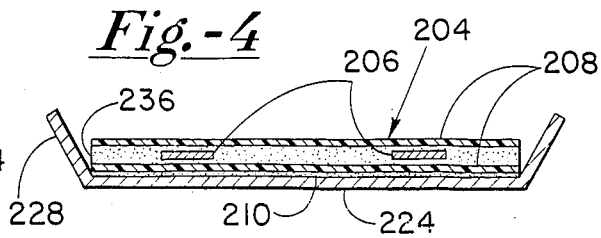

DAMPED MAGNETIC HEAD SUSPENSION ASSEMBLY

CROSS-REFERENCE TO RELATED APPLICATIONS

This application is a continuation-in-part of U.S. patent application, Ser. No. 895,835, filed Aug. 12, 1986.

FIELD OF THE INVENTION

This invention relates to an improved magnetic head suspension assembly, and in a particular to an assembly having a flexible circuit connection between the magnetic transducer and rigid arm flexible circuit.

BACKGROUND OF THE INVENTION

In magnetic disk storage devices, transducer heads are positioned and supported over rotation disks by means of an actuator assembly. The actuator is made up of rigid support arms to which head suspension assemblies are attached. Each head rides over its respective disk surface on an air bearing. The suspension allows for controlled motion of the head so that it flies over the desired track at the proper height and attitude. Vibration of the support arm affects this head-disk relationship causing signal degradation, off-tracking errors, or even crashing of the head into the disk. Damping all modes of vibration has been achieved in the prior art by applying viscoelastic adhesive to the suspension and covering it with a constraining member as shown in EPO Publication No. 121057. In U.S. Pat. No. 4,645,280 flexible circuits have been shown to be a viable method of electrically interconnecting thin film style heads to the arm flexible circuit. Current practice though, is still the use of twisted fine wires routed through a tube. The tube is attached to the suspension by wire captures which are an obstacle to reducing the profile height of suspensions.

SUMMARY OF THE INVENTION

An objective of this invention is to use a flexible circuit to provide an electrical path between the rigid support arm and a thin film style head. The flexible circuit serves as a constraining layer of a suspension damping system that damps all vibration modes of the head suspension assembly.

Another objective of the invention is to provide electrical connections between the support arm flexible circuit and a thin film style head without using wire-in-tube designs. Wire-in tube designs are undesirable since the wire tends to break due to the excessive wire handling involved and crimping into the wire captures. For electromagnetic shielding purposes the individual fine wires of the wire-in-tube design have been twisted. Such twisting is, of course, difficult to control, especially when fine wires are fed into a relatively small tube.

A further objective is to eliminate the need for wire captures. This is a necessary step in providing for a lower profile head suspension assembly which allows reduced disk spacing in the drive unit.

In accordance with this invention, a damped magnetic head suspension assembly comprises a suspension system which includes a flexible circuit attached to the suspension by viscoelastic adhesive. In this arrangement the circuit acs as a constraining layer to the adhesive for improved damping. Damping is provided by the adhesive and flexible circuit which both must cover substantially the entire width of the suspension assembly. At the end of the flexible circuit, the conductive traces are laminated in a very thin and narrow plastic film that allows full freedom of motion of the head so as to not affect its flying performance. The conductive traces, typically copper, are attached to the head termination pads by wire bonding, solderable conductive epoxy, or other suitable means for forming electrical connections between conductors. The other end of the suspension flexible circuit is terminated to the support arm flexible circuit by appropriate solder methods.

The magnetic head suspension assemblies for the invention which employ flexible circuits are more reliable, can provide EMI (electromagnetic interference) shielding and a controlled impedance, and are less expensive to produce than magnetic head suspension assemblies employing wire-in-tube designs.

The magnetic head suspension assemblies provide damping which may be tailored to the application. The adhesive can be applied to the suspension in various patterns such that portions of the flexible circuit are not supported by adhesive over the load beam and preload radius zone. Also, the thickness of both the adhesive and the constraining layer portion of the circuit can be varied to achieve the desired damping.

BRIEF DESCRIPTION OF THE DRAWINGS

A detailed description of the invention is hereafter described with specific reference being made to the drawing in which:

FIG. 1 is a perspective view of a conventional magnetic head suspension assembly;

FIG. 2 is a perspective view of the preferred embodiment showing a head suspension assembly having a flexible circuit;

FIG. 3 is a side elevational view of the arm of FIG. 2 showing a bridge in the flexible circuit over the preload radius zone;

FIG. 4 is a cross-sectional view of the suspension of FIG. 2 through line 4—4; and FIG. 5 is a cross-sectional view of FIG. 2 showing a conductive coating shield.

FIGS. 6A and 6B are bode plots that demonstrate the damping achieved by the invention in comparison to that achieved by a conventional suspension.

DETAILED DESCRIPTION OF THE INVENTION

With reference to FIG. 1 a conventional magnetic head suspension assembly 18 is shown. The assembly includes a slider, or a transducer head 12 which is electrically connected by fine insulated wires 14 routed through a polytetrafluoroethylene (PTFE) tube 16. Tube 16 is held to suspension 18 by wire captures 20 and center tang 22. As noted previously, wire captures and center tangs are highly undesirable since they may damage wires 14 and are relatively large which would inhibit closer disk spacing. The magnetic head suspension assembly is also relatively difficult to make with tangs and captures. Assemblies such as shown in FIG. 1 have inherent resonance problems associated with them. The industry generally needs suspension assemblies which ave maximum damping in the 2000 Hertz range at the first bending mode.

The preferred form of the invention is shown in FIGS. 2 through 5. The inventive suspension 200 of FIGS. 2 through 5 does not need wire captures and center tangs because electrical connections between a support arm assembly (not shown) and slider 202 are provided by a suspension flexible circuit 204.

Flexible circuit 204 includes copper traces 206 which are embedded within circuit adhesive 236 which is in turn laminated between a pair of flexible films 208. Flexible films 208 may be formed from a polyimide such as Kapton V brand polyimide film or a polyester such as Mylar brand flexible polyester films, both from E. I. DuPont de Nemours Company of Wilmington, Del. The film layers 208 are usually on order of 0.5-3 mils (13-76 microns) in thickness. The flexible circuit adhesive 236 is typically a modified acrylic adhesive also available from E. I. Dupont de Nemours Company. The Institute of Interconnecting and Packaging Electronic Circuits established IPC Standards regarding adhesive coated dielectric films in standard IPC-FC-232B. The acrylic adhesive referred to above may include Pyralux ® brand modified acrylic adhesives of EI. DuPont de Nemours & Co. of Wilmington, Del. Uncured acrylic monomers are present in the adhesive. The flexible circuit should extend across at least about 90% of the arm width in any given cross-section of the load beam. As shown in the figures the flexible circit 204 extends cross the width of the suspension between rails 228. This is needed to effect torsional mode damping.

Conductors 206 may be individual copper traces or may be formed by chemical etching a thin copper layer as is known in the art to provide separate conductive paths. Alternatively, conductive polymer films and inks may be used to define conductive paths. As shown in FIG. 4, the profile of the flexible circuit 204 is lower than possible with wire-in-tube designs. Therefore, disk spacing when using suspension assemblies of the invention can be reduced.

Flexible circuit 204 is attached to the suspension by a viscoelastic adhesive 210. Generally, any adhesive which will bond to the flexible circuit and which after curcint is at least somewhat elastic may be employed. Pressure sensitive adhesives, silicone rubbers and polyurethane adhesives are all suitable. The chemical curing polyurethanes produced by Products Research and Chemical Corporation of Glendale, Calif. under its designation PR 1564 cures to a flexible, cold flow-resistant rubber which provides good adherence and damping. Kalex brand elastomeric adhesives from HV Hardman Company of Belleville, N.J. are also suitable for the purposes of the invention.

The adhesive 210 may be applied to the suspension along the entire length of the contact between the suspension and the flexible circuit. Alternatively, the adhesive may be applied at spaced intervals so as to tack the flexible circuit to the suspension. In general, increased damping will be provided if adhesive contacts more of the flexible circuit and suspension surface.

The thickness of the adhesive layer 210 may vary depending on its adherence and damping properties. Typically a 1 to 6 mil (25-152 micron) layer 210 is formed between flexible circuit 204 and suspension 200. The adhesive layer 210 thickness may also vary along the length of the suspension assembly to provide different damping proportions along the assembly.

The low profile of the magnetic head suspension assemblies of the invention may be further reduced by reducing the suspension rail 228 height. Since no wire captures or center tangs are required with the invention production is greatly simplified since no precision metal bending is involved.

As shown in FIG. 3, the flexible circuit 204 may form a bridge 220 over the preload radius zone 222 of the suspension near the base 212 to minimize the effective of the flexible circuit on the spring constant of the suspension. As illustrated in FIG. 3, the preload radius zone 222 is that portion of the load beam 224 between the end of the rails 228 and the base 212 where the load beam 224 is bent to provide a preload force or spring characteristic to the transducer head end of the load beam 224. In the preferred embodiment, the zone 222 is located in the area where the load beam 224 is bent. Another means to reduce the influence of the flexible circuit on the spring characteristics is to provide a hole through the load beam 224 portion of the suspension near the preload radius zone. The flexible circuit could then be routed on either or both sides of the opening between the head 202 and support arm.

Electrical connections between the conductive traces of flexible circuit and head or actuator may be made by thermosonic or ultrasonic bonding, soldering or conductive epoxies.

The bode or frequency response plot shown in FIG. 6B demonstrates the damping achieved by the invention. FIGS. 6A and 6B compare bending natural frequency and gain of a conventional suspension without wires to a suspension having a flexible film of Kapton V brand polyimide bonded thereto. A 2 mil (50 micron) polyimide layer and a 4 mil (102 micron) adhesive layer extended the length of the load beam 224 portion of the suspension. The polyimide and adhesive layer extended across substantially the entire width of the load beam to provide damping. Gain is obtained by dividing the suspension base amplitude from the suspension amplitude according to the relation: Gain (dB)=20 log (Suspension amplitude/Suspension base amplitude).

The table below identified as Table 1 shows that the damped parts require a higher input energy to achieve a gain deflection amplitude.

TABLE 1

|  | Gain (db), undamped | Gain (dB), damped |
| --- | --- | --- |
| 1st Bending Mode | 43 | 21 |
| 2nd Bending Mode | 2 | eliminated |

The damped suspension shows a decrease of 22 dB in gain as shown in Table 1 above. Torsional mode damping is also an advantage in the damped suspension. As shown, there is a 10 dB decrease in gain in the torsional mode at about 2700 Hz with the inventive suspension.

FIG. 5 shows a cross-section of a suspension arm assembly in which the flexible circuit 204 includes a thin conductive coating 244 which extends across the width of flexible circuit 204. Coating 244 may be included as a ground plane to improve attenuation of electromagnetic interference. As shown, coating 244 may be covered with a flexible film layer 208.

Alternatively, the suspension may be formed without an upper flexible film layer over coating 244.

In considering the invention it must be remembered that the disclosure is illustrative only and that the scope of the invention is to be determined by the appended claims.

What is claimed is:

1. A damped magnetic head suspension assembly defining a longitudinal axis, said assembly comprising:

(a) a load beam having upper and lower ends;
(b) flexible circuit means for providing electrical connection between said upper end and said lower end of the load beam along the longitudinal axis, said flexible circuit means including a flexible circuit film having a plurality of conductors embedded in a thin, flexible, layer of insulating material and laminated between a first layer comprising a thin, flexible first film layer and a second layer comprising one of a thin, flexible second film layer and a thin, conductive coating layer, said flexible circuit film being adhesively bonded to said load beam in at least one spot along the longitudinal axis by adhesive disposed between said first layer and said load beam;
wherein said first film layer is of a thickness no greater than 3 mils; and
wherein said adhesive is of a thickness no greater than 6 mils in order to provide damping.

2. The assembly of claim 1 wherein said flexible circuit film is adhesively bonded to said load beam by a plurality of discrete adhesive spots at predetermined locations along said load beam to provide predeterming damping.

3. The assembly of claim 1 wherein said flexible circuit film is adhesively bonded to said load beam by a plurality of discrete adhesive spots at predetermined locations along said load beam to provide damping at about 2000 Hertz at the first bending mode.

4. The assembly of claim 1 wherein said second layer is a thin flexible second film layer.

5. The assembly of claim 1 wherein said second layer is a thin conductive coating layer.

6. The assembly of claim 1 wherein said second layer comprises a thin, conductive coating layer and a thin, flexible second film layer.

7. The assembly of claim 1 wherein each of said first and second film layers is a plastic film layer.

8. In a magnetic head suspension assembly defining a longitudinal axis, said assembly of the type including a base, a load beam having upper and lower ends, the upper end being attached to the base, the improvement comprising:
flexible circuit means for providing electrical connection between said upper end to the lower end area of said load beam along the longitudinal axis, said flexible circuit means including a flexible circuit film having a plurality of conductors embedded in a thin, flexible, insulating material and laminated between a first layer comprising a thin, flexible first film layer and a second layer comprising one of a thin, flexible second film layer and a thin, conductive coating layer, said flexible circuit film being adhesively bonded to said load beam in at least one spot along the longitudinal axis between said lower end of said load beam and said base by adhesive disposed between said first layer and said load beam;
wherein said first film layer is of a thickness no greater than 3 mils; and
wherein said adhesive is of a thickness no greater than 6 mils to provide damping.

9. The magnetic head suspension assembly of claim 8 wherein said flexible circuit film is adhesively bonded to said load beam by a plurality of discrete adhesive spots at predetermined locations along said load beam to provide damping at about 2000 Hertz at the first bending mode.

10. The magnetic head suspension assembly of claim 8 wherein said flexible circuit film is adhesively bonded to said load beam by a continuous strip of adhesive from said lower end to an area adjacent said preload radius zone.

11. The magnetic head suspension assembly of claim 8 wherein said flexible circuit film is adhesively secured to said load beam at points on both sides of said preload radius zone, and said flexible circuit film forms a bridge at said preload radius zone to minimize any effect on the gram load of the assembly.

12. A method for providing electrical connections and damping in a magnetic head suspension assembly of the type including a base a load beam having upper and lower ends, the method comprising:
(a) adhering a flexible circuit to said load beam with an adhesive, said flexible circuit comprising a flexible circuit film having a plurality of conductors embedded in a thin, flexible insulating material and laminated between a first layer comprising a thin, flexible first film layer and a second layer comprising one of a thin, flexible second film layer and a thin, conductive coating layer, said flexible circuit film and adhesive extending across at least 90% of the width of said load beam, said first film layer having a thickness of between about 0.5-3 mils and said adhesive having a thickness in the range of between about 1-6 mils.

13. In a magnetic head suspension assembly defining a longitudinal axis, said assembly of the type including a base, a load beam having upper and lower ends, the upper end being attached to the base and said load beam defining a preload radius zone, the improvement comprising:
flexible circuit means for providing electrical connection between said upper end to the lower end area of said load beam along the longitudinal axis, said flexible circuit means including a flexible circuit film having a plurality of conductors embedded in a thin, flexible insulating material and laminated between a thin, flexible, plastic film layer and a conductive layer spaced from said conductors as a ground plane for electromagnetic interference shielding, said flexible circuit film being adhesively bonded to said load beam in at least one spot along the longitudinal axis between said lower end of said load beam and said base, said film and adhesive extending across substantially the entire width of said load beam;
wherein said flexible circuit film is of a thickness in the range of 0.5-3 mils; and
wherein said adhesive is of a thickness in the range of 1-6 mils to provide damping.

* * * * *